(12) United States Patent
Li et al.

(10) Patent No.: US 7,180,740 B2
(45) Date of Patent: Feb. 20, 2007

(54) METHOD AND APPARATUS FOR SIDE-TYPE HEAT DISSIPATION

(75) Inventors: Nien-Lun Li, Hsin-Chuang (TW); Yun-Yeu Yeh, Taipei Hsien (TW); To Hsu, Hsin-Chuang (TW); Hung-Chung Chu, Hsin-Chuang (TW); Cheng-Hsing Lee, Hsin-Chuang (TW)

(73) Assignee: Datech Technology Co., Ltd., Taipei Hsien (TW)

( * ) Notice: Subject to any disclaimer, the term of this patent is extended or adjusted under 35 U.S.C. 154(b) by 173 days.

(21) Appl. No.: 10/952,811

(22) Filed: Sep. 30, 2004

(65) Prior Publication Data

US 2006/0067050 A1 Mar. 30, 2006

(51) Int. Cl.
*H05K 7/20* (2006.01)

(52) U.S. Cl. ............... 361/697; 165/80.3; 174/16.3; 257/722

(58) Field of Classification Search .............. 361/695, 361/697; 257/706, 712; 174/16.3; 165/80.3, 165/185; 415/213.1
See application file for complete search history.

(56) References Cited

U.S. PATENT DOCUMENTS

| | | | | |
|---|---|---|---|---|
| 4,953,634 A | * | 9/1990 | Nelson et al. | 165/147 |
| 5,421,402 A | * | 6/1995 | Lin | 165/80.3 |
| 5,597,035 A | * | 1/1997 | Smith et al. | 165/80.3 |
| 5,957,194 A | * | 9/1999 | Azar | 165/80.3 |
| 5,963,424 A | * | 10/1999 | Hileman et al. | 361/695 |
| 6,154,368 A | * | 11/2000 | Scofield | 361/719 |
| 6,364,009 B1 | * | 4/2002 | MacManus et al. | 165/185 |
| 6,450,252 B1 | * | 9/2002 | Liao | 165/154 |
| 6,533,028 B2 | * | 3/2003 | Sato | 165/80.3 |
| 6,819,564 B2 | * | 11/2004 | Chung et al. | 361/697 |
| 6,827,549 B1 | * | 12/2004 | Horng et al. | 415/68 |

* cited by examiner

*Primary Examiner*—Boris Chervinsky
(74) *Attorney, Agent, or Firm*—Troxell Law Office, PLLC

(57) ABSTRACT

The present invention is a method and an apparatus for side-type heat dissipation. According to the present invention, a heat dissipation unit is deposed on a CPU to absorb the heat it generates; a cover is covered on the unit, where two openings are at two opposite ends and one of the openings has an inclined plane as well as a fan, and one of the openings is corresponding to a fan on the computer case; and an air flow is guided by a fan to the heat dissipation unit and is directed to a fan of a power supplier to be blown out of the computer case. By doing so, no thermal cycling will occur in the computer case and better heat-dissipation efficiency can be obtained.

7 Claims, 8 Drawing Sheets

METHOD AND APPARATUS FOR SIDE-TYPE HEAT DISSIPATION

FIELD OF THE INVENTION

The present invention relates to side-type heat dissipation; more particularly, relates to a method and an apparatus that directly dissipate the heat generated by a CPU out of the computer case to obtain smooth and better heat dissipation effect.

DESCRIPTION OF THE RELATED ARTS

A method of a prior art for heat dissipation is shown in FIG. 6. As shown in the figure, a set of fins 6 for heat dissipation is deposed on a CPU and a heat-dissipating fan 61 is set for the fins 6. The fins 6 absorb the heat from the CPU and an air flow is guided by the heat-dissipating fan 61 to flow through the fins 6 to carry out the heat. When the heat in the fins is carried out, the air flow remains in the computer case and later will be blown out of the computer case by an extra fan 62 set on the computer case.

Yet, because there is usually a distance between the fins 6 and the fan 62 on the computer case, before the air flow is blown out of the computer case, the air flow is cycled within the computer case; and, when the air flow is cycled within the computer case, the air flow will be absorbed by the heat-dissipating fan 61 again to flow through the fins 6 so that the heat dissipation efficiency is not good owing to the heat cycling.

Another prior art according to U.S. Pat. No. 6,711,016 B2, as shown in FIG. 7, comprises a base 110, a set of fins 130 deposed on the base 110, a guiding shell 140 covered on the base 110 and the fins 130, and a heat-dissipating fan 120 deposed opposite to the base 110, where there is a curved surface 134 of the fins 130 corresponding to the heat-dissipating fan 120. When using the prior art, as shown in FIG. 8, the heat from the heat source, the CPU, is transmitted to the fins 130 through the base 110. An air flow is guided to the fins 130 by the heat-dissipating fan 120. Because there is a curved surface 134 of the fins 130 corresponding to the heat-dissipating fan 120, the air flow which becomes a hot air-flow on passing through the fins can be smoothly directed out without causing air turbulence in the fins 130.

According to the above prior art of the U.S. patent, the hot air-flow can be smoothly directed out of the fins without causing air turbulence. Nevertheless, owing the whole structure design, when the hot air-flow is directed out, it remains in the computer case. In addition, another fan on the computer case is usually far from the heat dissipation device on the main board so that, before the fan on the computer case absorbs the hot air-flow and blow it out of the computer case, the hot air-flow is cycled in the computer case and is absorbed by the heat-dissipating fan 120 again so that the heat dissipation efficiency is not good owing to the heat cycling in the computer case.

SUMMARY OF THE INVENTION

Therefore, the main purpose of the present invention is that, after the heat generated by a CPU is absorbed by a heat dissipation unit, an air flow is guided to flow through the heat dissipation unit by a fan to carry the heat out from an opening of a cover to a fan of a power supplier and to be directly blown out of the computer case so that no thermal cycling occurs in the computer case and a better heat-dissipation efficiency can be obtained.

Another purpose of the present invention is that, by using the fan of a power supplier to blow the air flow carrying heat out of the computer case, a fan can be saved from the computer case.

To achieve the above purposes, the present invention is a method and an apparatus for side-type heat dissipation. The apparatus for side-type heat dissipation comprises a heat dissipation unit, a cover covered on the heat dissipation unit and a fan at an end of opening of the cover. The method for side-type heat dissipation comprises the followings steps:

Step A—A heat dissipation unit is deposed on a CPU of a main board by a base of the heat dissipation unit, and an end of the heat dissipation unit is corresponding to a fan of a power supplier in a computer case.

Step B—A cover is covered on the heat dissipation unit; and an opening of the cover having an inclined plane, or another opening of the cover opposite to the opening having the inclined plane, is corresponding to the fan of the power supplier.

Step C—A heat-dissipating fan is deposed on the opening having the inclined plane. When corresponding the opening having the inclined plane to the fan of the power supplier, the heat-dissipating fan is a draught fan; or, when corresponding another opening of the cover opposite to the opening having the inclined plane to the fan of the power supplier, the heat-dissipating fan becomes an exhaust fan.

Step D—The heat generated by the CPU is absorbed to be transmitted to a plurality of fins of the heat dissipation unit through the base, and an air flow is guided by the heat-dissipating fan to a plurality of passages of the fins to carry the heat as forming a hot air-flow. The hot air-flow is directed to flow to one of the openings corresponding to the fan of the power supplier and is blown out of the computer case by the fan of the power supplier.

BRIEF DESCRIPTIONS OF THE DRAWINGS

The present invention will be better understood from the following detailed description of preferred embodiments of the invention, taken in conjunction with the accompanying drawings, in which FIG. 1 is a perspective view of the apparatus for side-type heat dissipation according to the present invention;

Figure 7:
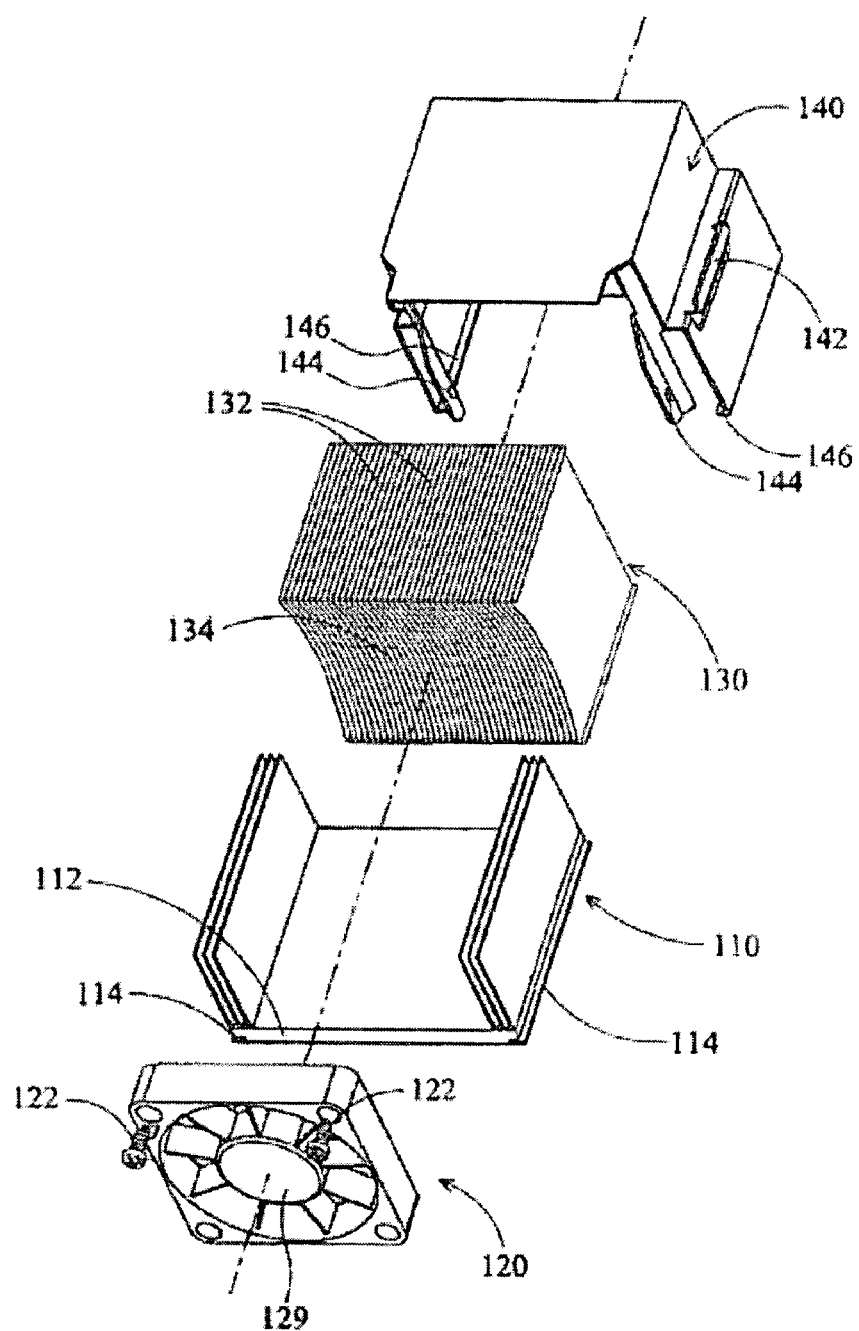
Figure 8:
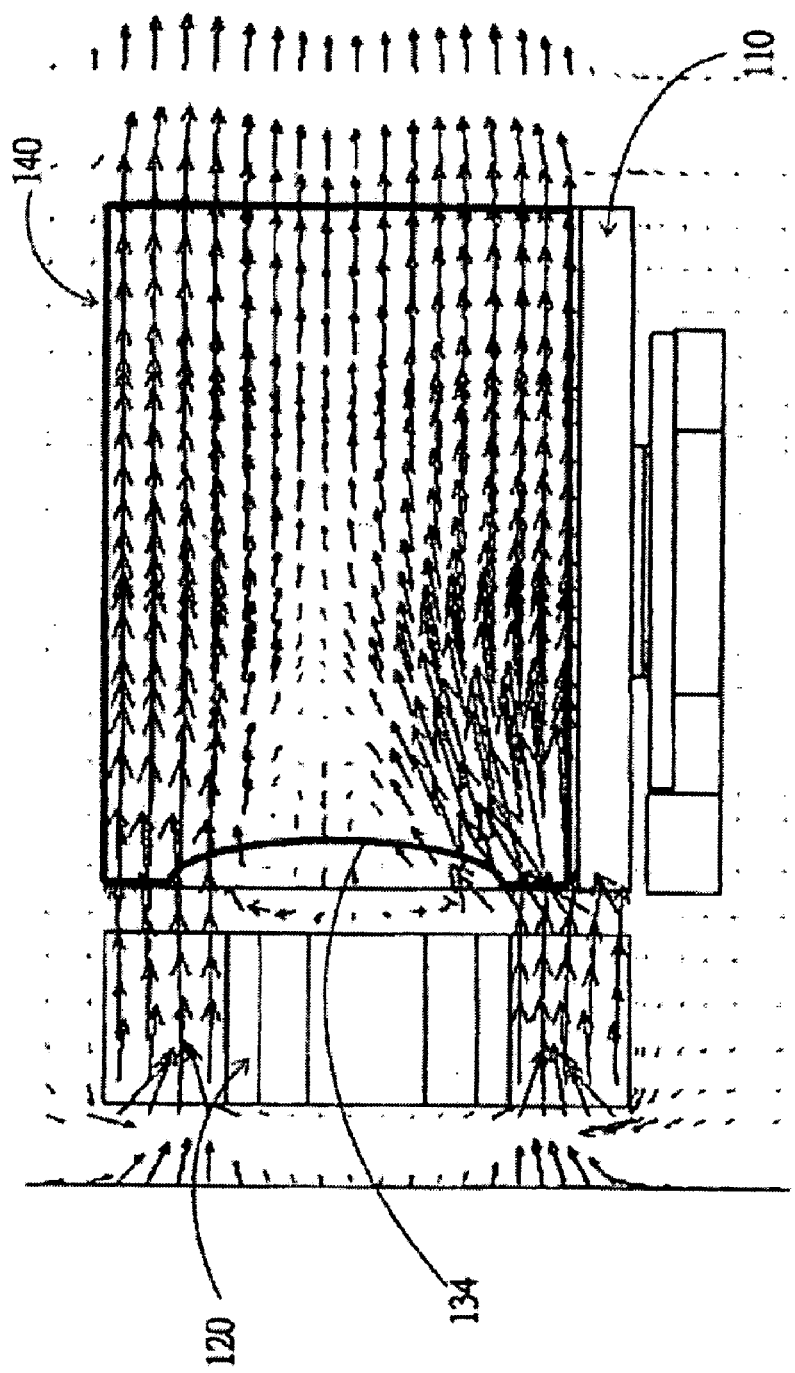

FIG. 7 is a view showing the structure of the heat dissipation module according to the prior art of U.S. Pat. No. 6,711,016 B2; and FIG. 8 is a view showing the heat flow simulation analysis according to the prior art of U.S. Pat. No. 6,711,016 B2.

DESCRIPTION OF THE PREFERRED EMBODIMENT

The following descriptions of the preferred embodiments are provided to understand the features and the structures of the present invention.

Figure 1:
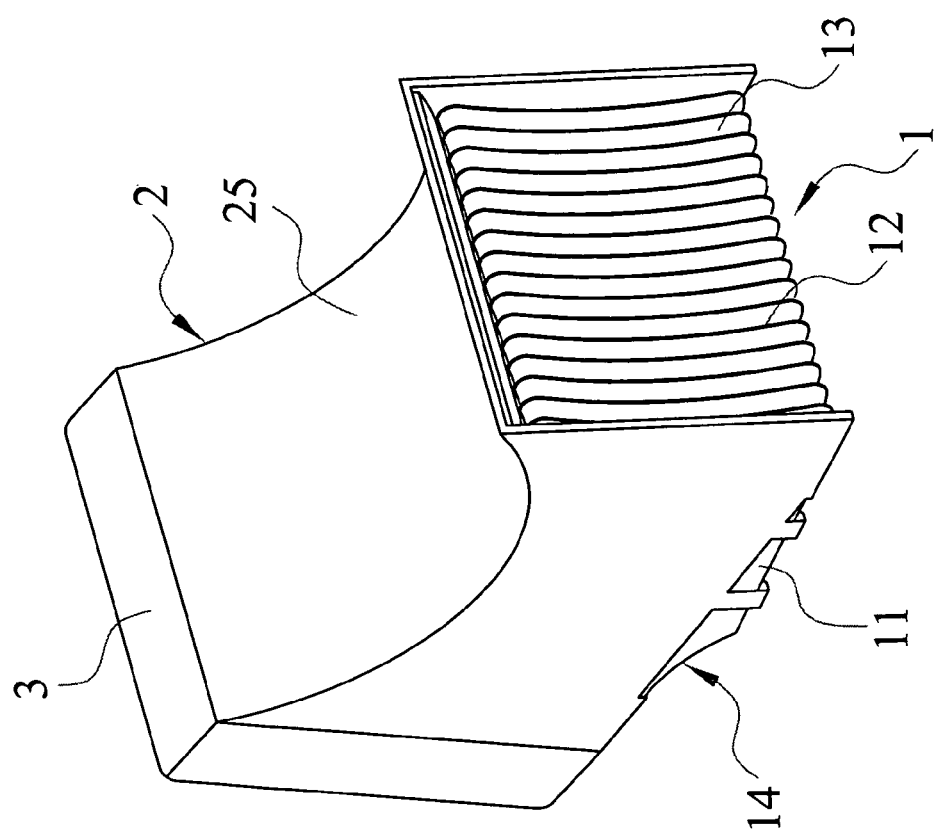
Figure 2:
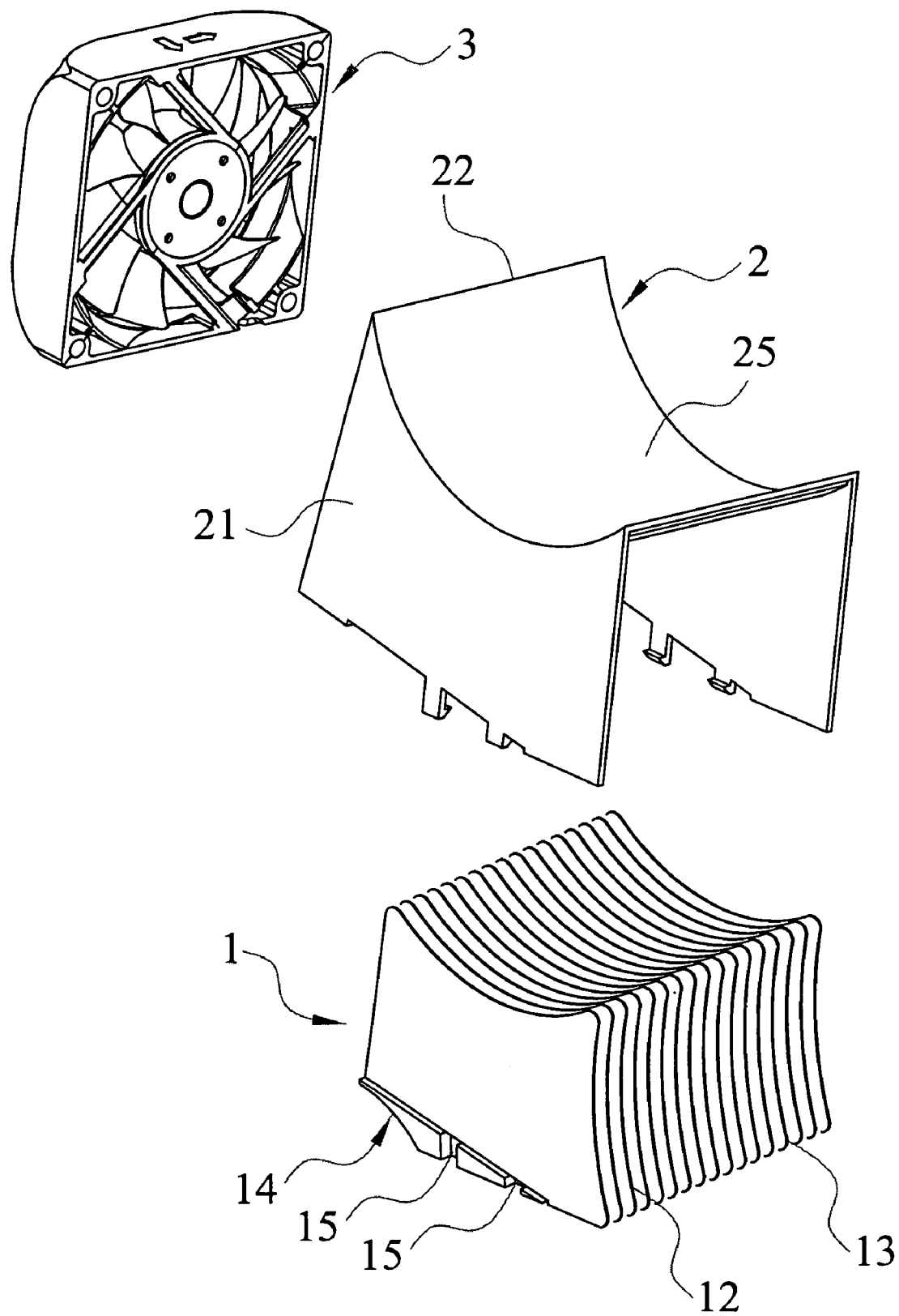
FIG. 2 is a view showing the structure of the apparatus for side-type heat dissipation according to the present invention.
Figure 3:
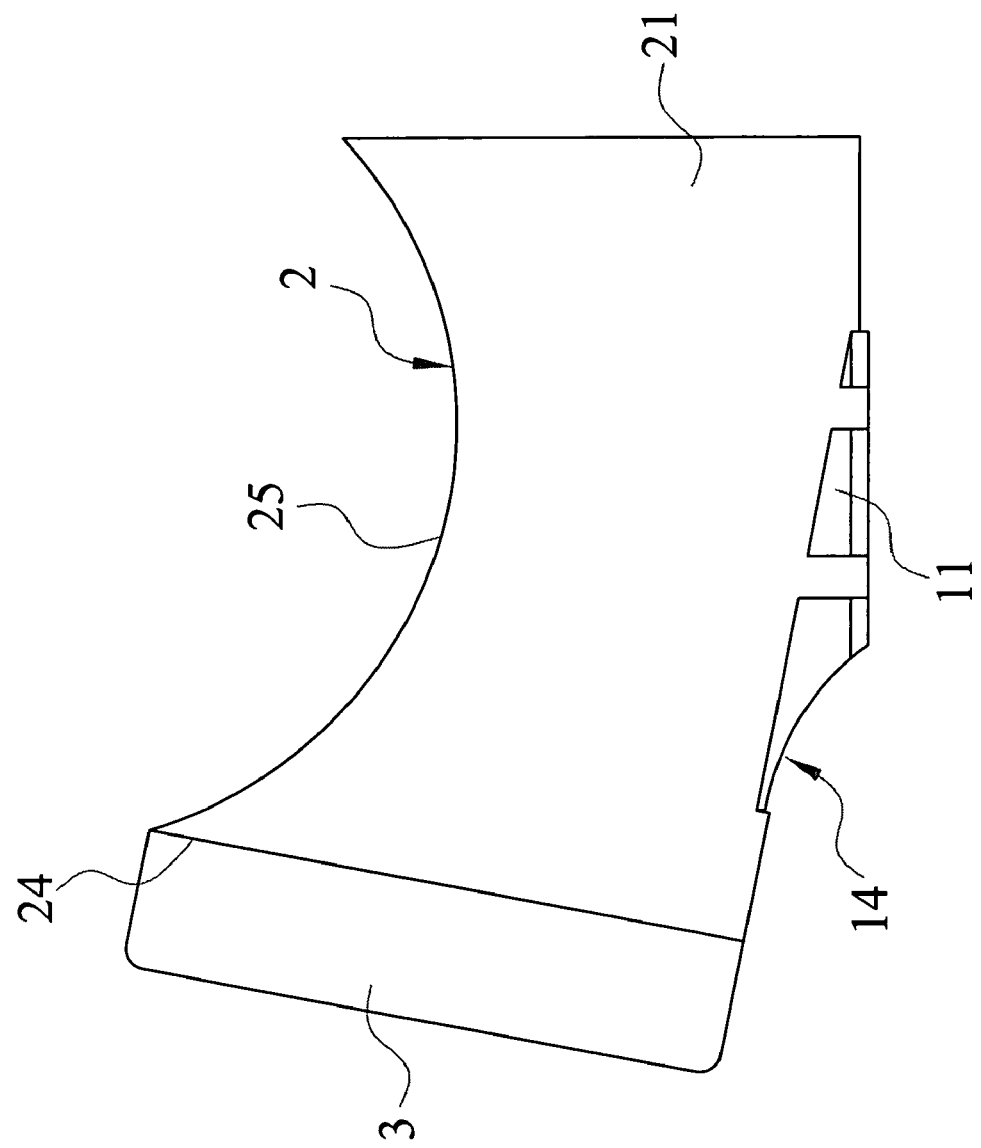
FIG. 3 is a side view of the apparatus for side-type heat dissipation according to the present invention.

Please refer to FIG. 1 through FIG. 3, which, according to the present invention, are a perspective view of the apparatus for side-type heat dissipation, a view showing the structure of the apparatus for side-type heat dissipation and a side view of the apparatus for side-type heat dissipation. As shown in the figures, the present invention is a method and an apparatus for side-type heat dissipation. The apparatus for side-type heat dissipation comprises a heat dissipation unit 1, a cover 2 and a fan 3. The method for side-type heat dissipation comprises steps of carrying the heat from a heat dissipation unit 1 through an air flow by a fan 3 and directing the air flow to a fan of a power supplier to be blown out of the computer case so that no thermal cycling occurs in the computer case and a better heat-dissipation efficiency can be obtained.

The above heat dissipation unit 1 is made of a material with better heat-dissipation efficiency, such as aluminum, copper, an alloy of aluminum or an alloy of copper. The heat dissipation unit 1 comprises a base 11 and a plurality of fins 12 extended from a surface of the base 1; and the top surface of the heat dissipation unit 1 is a curved surface. The fins 12 comprise passages 13 connecting two end surfaces of the heat dissipation unit 1 that every two adjacent fins 12 comprises one passage in between. An indentation 14 is located at an edge on the bottom surface of the base 11, and two slots 15 are located at two opposite sides on the bottom surface of the base 11 other than the edge having the indentation 14.

The cover 2 is covered on the heat dissipation unit 1. The cover 2 comprises two stoppers 21 at two sides, two openings 22, 23 corresponding to the two end surfaces of the heat dissipation unit 1, and a curved surface 25 on top corresponding to the top surface of the heat dissipation unit 1, where one of the openings 22 comprises an inclined plane so that the bottom lines of the two openings 22, 23 are on two surfaces with different heights. And the stoppers 21 at two sides of the cover 2 comprise a plurality of jointers, which can be hooks, extended downwardly to be locked to slots 15 at two sides on the bottom surface of the base 11 so that the cover 2 can be firmly covered on the heat dissipation unit 1.

The fan 3 is deposed on the opening 22 having an inclined plane 24, which is corresponding to an end of the passages 13. Every edges of the surface which is opposite to where the fan 3 connects with the cover 2 comprise arc surfaces. And the fan can be an exhaust fan or a draught fan. By the above structure, an apparatus for side-type heat dissipation is constructed.

Figure 4:
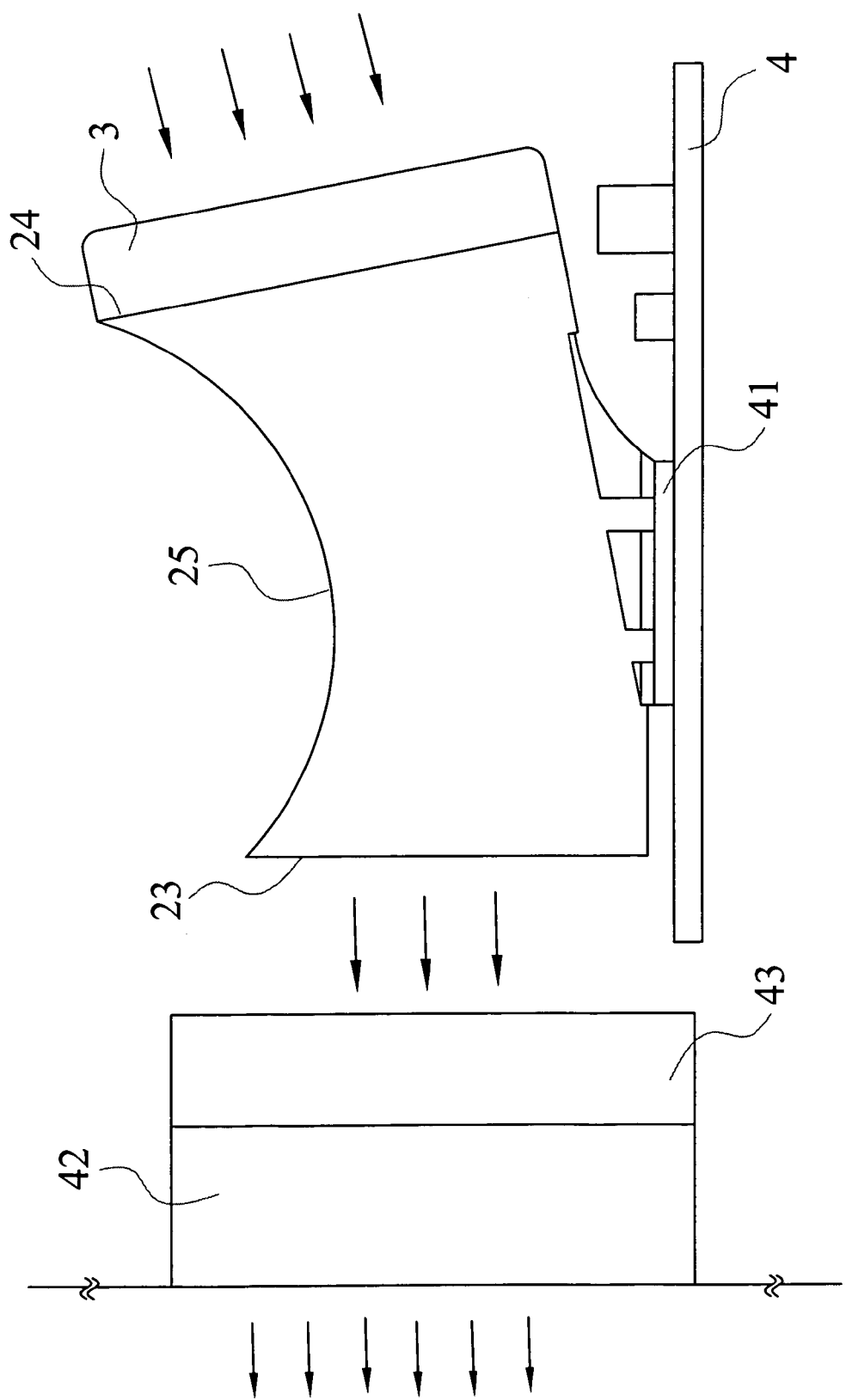
FIG. 4 is a view showing a status of use of the apparatus for side-type heat dissipation according to the present invention.
Figure 5:
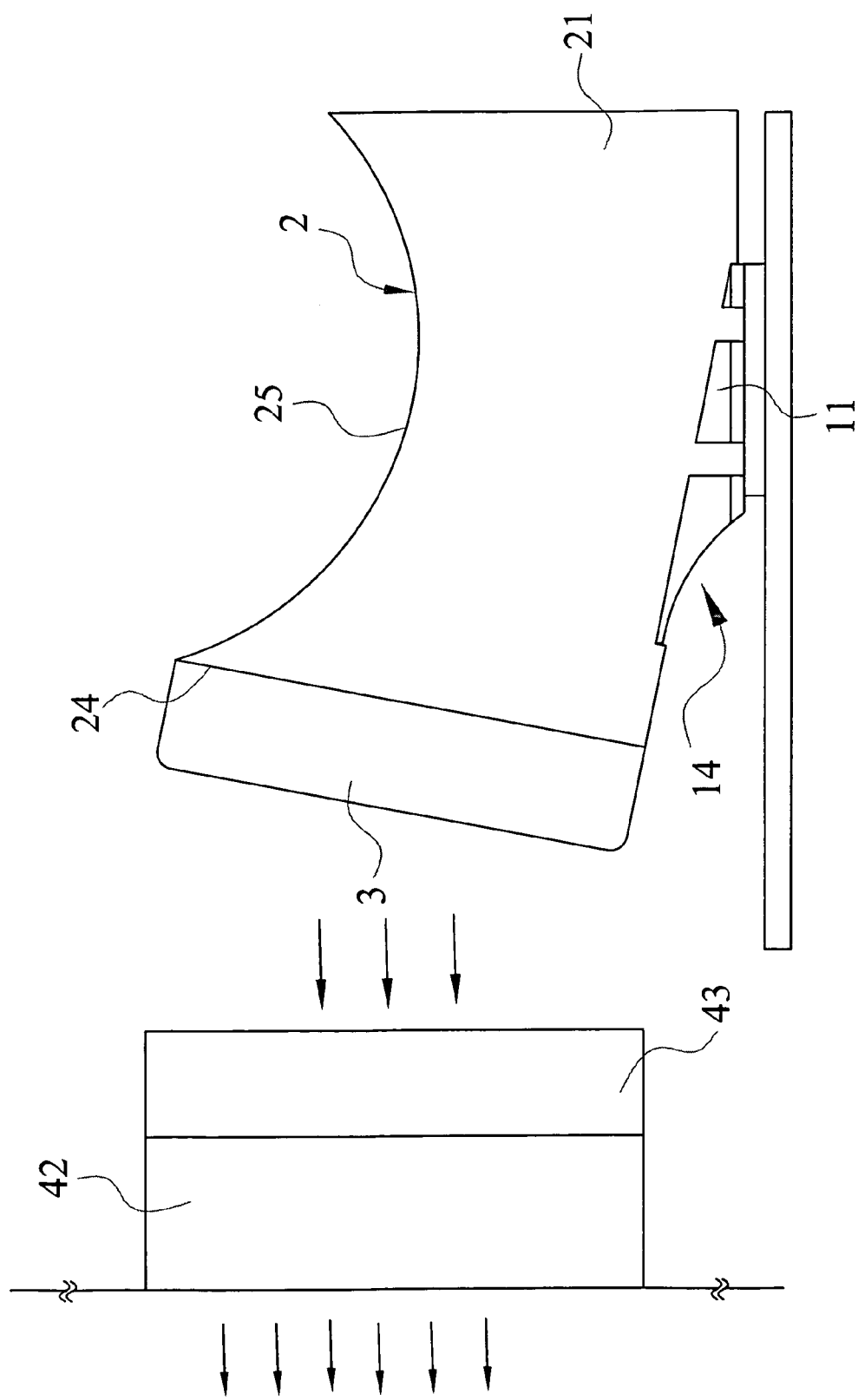
FIG. 5 is a view showing another status of use of the apparatus for side-type heat dissipation according to the present invention.
Figure 6:
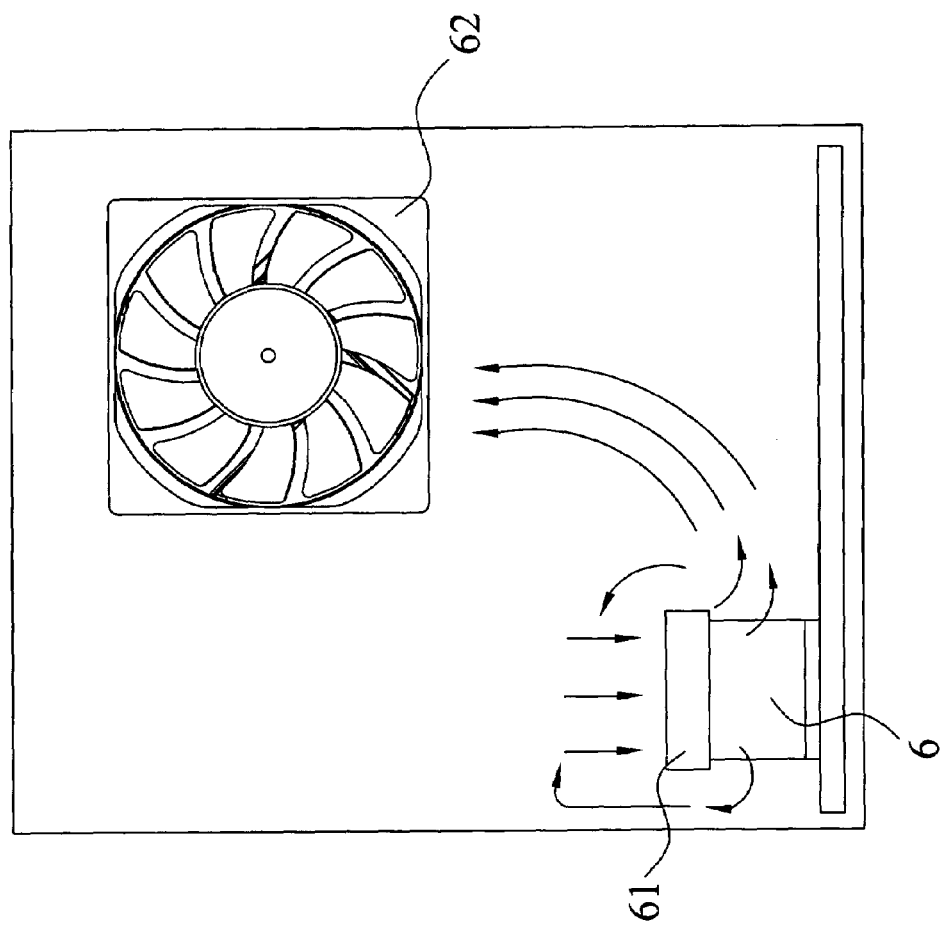
FIG. 6 is a view showing a status of use of a heat dissipation module according to a prior art.

Please refer to FIG. 4 and FIG. 5, which are views showing the method for side-type heat dissipation according to the present invention. The method for side-type heat dissipation comprises the following steps:

Step A—A heat dissipation unit 1 is deposed on a CPU 41 of a main board 4 by a base 11 of the heat dissipation unit 1, and an end of the heat dissipation unit 1 is corresponding to a fan 43 of a power supplier 42 in a computer case. When deposing the heat dissipation unit 1, the electrical components 4 on the main board 4 can be eluded by an indentation 14 at an end on the bottom surface of the base 11.

Step B—A cover 2 is covered on the heat dissipation unit 1, and an opening 22 of the cover 2 having an inclined plane 24, or another opening 23 of the cover 2 opposite the previous opening 22, is corresponding to the fan 43 of the power supplier 42.

Step C—A heat-dissipating fan 3 is deposed on the opening 22 having the inclined plane 24, wherein, by corresponding the opening 22 having the inclined plane 24 to the fan 43 of the power supplier 42, the heat-dissipating fan 3 is a draught fan; or, by corresponding the other opening 23 of the cover to the fan 43 of the power supplier 42, the heat-dissipating fan 3 is an exhaust fan.

Step D—Please refer to FIG. 4, which is a view showing a status of use according to the present invention. As shown in the figure, the fan 3 is deposed on the opening 22 having an inclined plane 24, and the opening 22 having an inclined plane 24 is corresponding to the fan 43 of the power supplier 42 so that the heat-dissipating fan 3 is a draught fan. When the heat generated by the CPU 41 is absorbed by the base 11 of the heat dissipation unit 1 and is transmitted to a plurality of fins 12 on the base 11, an air flow is guided by the heat-dissipating fan 3 to carry the heat out of the cover 2 from the opening having an inclined plane while forming a hot air-flow; and the hot air-flow is directed to the fan 43 of the power supplier 42. Because the fan of the power supplier is corresponding to an end of the computer case, the hot air-flow can be blown out of the computer case by the fan of the power supplier so that no thermal cycling occurs in the computer case and better heat-dissipation efficiency can be obtained.

Please refer to FIG. 5, which is a view showing another status of use according to the present invention. As shown in the figure, the other opening 23 other than the opening 22 having an inclined plane 24 is corresponding to the fan 43 of the power supplier 42 so that the heat-dissipating fan 3 on the opening 22 having an inclined plane 24 is an exhaust fan. When the heat generated by the CPU 41 is absorbed by the base 11 of the heat dissipation unit 1 and is transmitted to a plurality of fins 12 on the base 11, an air flow is guided by the heat-dissipating fan 3 to carry the heat out of the cover 2 from the other opening while forming a hot air-flow; and the hot air-flow is directed to the fan 43 of the power supplier 42. Because the fan of the power supplier is corresponding to an end of the computer case, the hot air-flow can be blown out of the computer case by the fan of the power supplier while the air pressure of the hot air-flow is increased by the curved surface at the top of the cover to achieve an effect of direct blow. So, no thermal cycling occurs in the computer case and better heat-dissipation efficiency can be obtained.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. An apparatus for side-type heat dissipation, comprising:
a heat-dissipation unit having a base, and a plurality of fins extended from a surface of said base, said base having an indentation at an edge on a surface opposite to said fins, said fins having a curved surface opposite to said base;
a cover covering said heat dissipation unit, said cover having a stopper respectively at each of two opposite sides of said cover, said cover having an opening respectively corresponding to each of two opposite end surfaces of said heat dissipation unit, one of said openings having an inclined plane, said cover having a curved surface corresponding to said curved surface of said fins; and
a heat-dissipating fan located in said opening having said inclined plane, said heat-dissipating fan having a curved surface respectively at every edge of a surface opposite to said cover.

2. The apparatus according to claim 1, wherein said heat dissipation unit is made of a material selected from a group consisting of aluminum, copper, an alloy of aluminum, and an alloy of copper.

3. The apparatus according to claim 1, wherein a slot is located respectively at each of two opposite sides on a surface of said base and said surface of said base is opposite to said fins.

4. The apparatus according to claim 1, wherein said stopper comprises a plurality of jointers extended toward said base to lock on a surface of said base and said surface of said base is opposite to said fins.

5. The apparatus according to claim 4, wherein said jointer is a hook.

6. The apparatus according to claim 1, wherein said heat-dissipating fan is an exhaust fan.

7. The apparatus according to claim 1, wherein said heat-dissipating fan is a draught fan.

* * * * *